(12) United States Patent
Boday et al.

(10) Patent No.: US 9,930,774 B2
(45) Date of Patent: Mar. 27, 2018

(54) FLEXIBLE-TO-RIGID TUBING

(71) Applicant: International Business Machines Corporation, Armonk, NY (US)

(72) Inventors: Dylan J. Boday, Tucson, AZ (US); Joseph Kuczynski, North Port, FL (US); Robert E. Meyer, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/423,669

(22) Filed: Feb. 3, 2017

(65) Prior Publication Data

US 2017/0145164 A1 May 25, 2017

Related U.S. Application Data

(62) Division of application No. 13/940,367, filed on Jul. 12, 2013, now Pat. No. 9,655,228, which is a division
(Continued)

(51) Int. Cl.
*H05K 1/02* (2006.01)
*C08G 77/50* (2006.01)
(Continued)

(52) U.S. Cl.
CPC ............ *H05K 1/0272* (2013.01); *B29C 71/04* (2013.01); *C08F 126/06* (2013.01); *C08G 18/02* (2013.01);
(Continued)

(58) Field of Classification Search
CPC .. H05K 1/0201; H05K 1/0203; H05K 1/0272; H05K 7/20; H05K 7/20509;
(Continued)

(56) References Cited

U.S. PATENT DOCUMENTS 3,539,488 A * 11/1970 Hornbaker ............ C08F 259/04
522/117
4,458,104 A 7/1984 Penneck et al.
(Continued)

FOREIGN PATENT DOCUMENTS

CN 2269511 Y 12/1997
DE 102008036677 A1 2/2010
(Continued)

OTHER PUBLICATIONS

TYGON Inert Tubing Formulation SE-200, printed from http://www.tygon.com/uploadedFiles/SGtygon/Documents/Tygon_Tubing/Tygon-InertTubing-SE200.pdf on Aug. 26, 2010.
(Continued)

*Primary Examiner* — Walter B Aughenbaugh
(74) *Attorney, Agent, or Firm* — Matthew J. Bussan

(57) ABSTRACT

A flexible-to-rigid tube is flexible when routed and is then rigidized to increase burst strength. According to the preferred embodiments of the present invention, the flexible-to-rigid tube is included in a cooling plate assembly for transferring heat from electronic components mounted on a circuit board. In one embodiment, the flexible-to-rigid tube (while in a flexible state) includes a polydimethylsiloxane (PDMS) or other silicone containing pendant or terminal epoxy, vinyl and/or acrylate functional groups and an initiator (e.g., a sulfonium salt photoinitiator, a free radical photoinitiator, or a thermal initiator). In another embodiment, triallyl isocyanurate (TAIC) and an initiator are incorporated into a conventional PVC-based tubing material. The flexible-to-rigid tube changes from the flexible state to a rigid state via formation of a cross-linked network upon exposure to actinic radiation or heat.

13 Claims, 5 Drawing Sheets

Related U.S. Application Data of application No. 12/869,937, filed on Aug. 27, 2010, now Pat. No. 8,507,062.

(51) Int. Cl.

| | |
|---|---|
| *C08G 18/02* | (2006.01) |
| *H05K 13/00* | (2006.01) |
| *H05K 7/20* | (2006.01) |
| *H01L 23/373* | (2006.01) |
| *H01L 23/34* | (2006.01) |
| *H01L 23/46* | (2006.01) |
| *H01L 23/367* | (2006.01) |
| *F16L 11/12* | (2006.01) |
| *F16L 11/04* | (2006.01) |
| *C08G 77/04* | (2006.01) |
| *C08G 18/61* | (2006.01) |
| *C08F 126/06* | (2006.01) |
| *B29C 71/04* | (2006.01) |
| *C08L 83/04* | (2006.01) |
| *C08G 77/14* | (2006.01) |
| *C08L 83/06* | (2006.01) |
| *H01L 23/473* | (2006.01) |

(52) U.S. Cl.
CPC ........... *C08G 18/022* (2013.01); *C08G 18/61* (2013.01); *C08G 77/04* (2013.01); *C08G 77/14* (2013.01); *C08G 77/50* (2013.01); *C08L 83/04* (2013.01); *C08L 83/06* (2013.01); *F16L 11/04* (2013.01); *F16L 11/12* (2013.01); *H01L 23/34* (2013.01); *H01L 23/367* (2013.01); *H01L 23/373* (2013.01); *H01L 23/3737* (2013.01); *H01L 23/46* (2013.01); *H05K 1/0201* (2013.01); *H05K 1/0203* (2013.01); *H05K 7/20* (2013.01); *H05K 7/20509* (2013.01); *H05K 13/00* (2013.01); *H01L 23/473* (2013.01); *H01L 2924/00* (2013.01); *H01L 2924/0002* (2013.01); *Y10T 29/49002* (2015.01); *Y10T 29/49826* (2015.01); *Y10T 428/139* (2015.01)

(58) Field of Classification Search
CPC ......... H05K 13/00; H01L 23/34; H01L 23/36; H01L 23/367; H01L 23/373; H01L 23/3737; H01L 23/46; H01L 23/473; H01L 2924/00; H01L 2924/0002; F16L 11/04; F16L 11/12; Y10T 29/49002; Y10T 29/49826; Y10T 428/139; C08G 18/02; C08G 18/022; C08G 18/61; C08G 77/04; C08G 77/14; C08L 83/04; C08L 83/06; C08F 126/06; B29C 71/04
USPC .................................. 264/236, 495
See application file for complete search history.

(56) References Cited

U.S. PATENT DOCUMENTS

| | | | | |
|---|---|---|---|---|
| 4,487,707 A | | 12/1984 | Holzknecht | |
| 4,559,382 A | * | 12/1985 | Martens | C08F 259/04 522/95 |
| 4,966,922 A | * | 10/1990 | Gross | C08K 5/0025 522/170 |
| 5,104,595 A | * | 4/1992 | Hunter | F16L 55/165 118/DIG. 10 |
| 5,706,861 A | * | 1/1998 | Wood | F16L 55/163 138/97 |
| 6,033,769 A | | 3/2000 | Brueggemann et al. | |
| 6,051,317 A | | 4/2000 | Brueggemann et al. | |
| 6,396,692 B1 | | 5/2002 | Farshi et al. | |
| 6,446,671 B2 | | 9/2002 | Armenia et al. | |
| 7,096,890 B2 | | 8/2006 | Woolstencroft et al. | |
| 7,112,254 B1 | | 9/2006 | Driver | |
| 7,127,902 B1 | | 10/2006 | Levy | |
| 7,762,332 B2 | | 7/2010 | Lopez et al. | |
| 8,087,430 B1 | | 1/2012 | Betz et al. | |
| 8,136,596 B2 | | 3/2012 | Lopez et al. | |
| 8,507,062 B2 | | 8/2013 | Boday et al. | |
| 8,747,977 B2 | | 6/2014 | Boday et al. | |
| 2002/0039869 A1 | | 4/2002 | Achille | |
| 2003/0207954 A1 | | 11/2003 | Hermann et al. | |
| 2004/0059054 A1 | | 3/2004 | Lopez et al. | |
| 2004/0190255 A1 | | 9/2004 | Cheon | |
| 2006/0012958 A1 | | 1/2006 | Tomioka et al. | |
| 2007/0167542 A1 | | 7/2007 | Lopez et al. | |
| 2008/0163631 A1 | | 7/2008 | Campbell et al. | |
| 2009/0213541 A1 | | 8/2009 | Butterbaugh et al. | |
| 2010/0233375 A1 | | 9/2010 | Lopez et al. | |
| 2012/0050994 A1 | | 3/2012 | Boday et al. | |
| 2012/0118534 A1 | | 5/2012 | Goth et al. | |
| 2012/0199237 A1 | | 8/2012 | Oyaizu et al. | |
| 2013/0151154 A1 | | 6/2013 | Nutley et al. | |
| 2013/0291369 A1 | | 11/2013 | Boday et al. | |
| 2014/0076524 A1 | | 3/2014 | Boday et al. | |

FOREIGN PATENT DOCUMENTS

| | | |
|---|---|---|
| KR | 20030002347 A | 1/2003 |
| WO | 2008124889 A1 | 10/2008 |

OTHER PUBLICATIONS

High-Performance Engineered Plastics, printed from http://www.tygon.com/product_detail.aspx?id=181484&printer=1 on May 7, 2010.

Gelest Reactive Silicones: Forging New Polymer Links, printed from http://www.gelest.com/company/pdfs/reactivesilicones.pdf on Aug. 26, 2010.

U.S. Appl. No. 12/869,937, to Boday et al., entitled "Flexible-To-Rigid Tubing", filed Aug. 27, 2010, assigned to International Business Machines Corporation.

U.S. Appl. No. 13/940,367, to Boday et al., entitled "Flexible-To-Rigid Tubing", filed Jul. 12, 2013, assigned to International Business Machines Corporation.

U.S. Appl. No. 15/423,709, to Boday et al., entitled "Flexible-To-Rigid Tubing", filed Feb. 3, 2017, assigned to International Business Machines Corporation.

U.S. Appl. No. 15/423,745, to Boday et al., entitled "Flexible-To-Rigid Tubing", filed Feb. 3, 2017, assigned to International Business Machines Corporation.

Wikipedia contributors, "Superabsorbent polymer", Wikipedia, The Free Encyclopedia, http://en.wikipedia.org/w/index.php?title=Superabsorbent_polymer&oldid=491998395 (accessed Aug. 15, 2012).

"CABLOC(R) Absorbent Polymers—Water Blocking Solutions for the Wire & Cable Industry", printed from <www.komdata.net/hm/03/0302/KOMDATA/assets/Cabloc_e.pdf> on Aug. 23, 2012.

"Evonik Industries—CABLOC(R) Products", printed from <http://www.creasorb.com/product/creasorb/en/products/cabloc/product-information/pages/default.aspx> on Aug. 15, 2012.

"Evonik Industries—Applications", printed from <http://www.creasorb.com/product/creasorb/en/products/cabloc/applications/pages/default.aspx> on Aug. 23, 2012.

Clyburn, Clinton E. III, "Long-Term Stability of Superabsorbent Gel for Cable Water-blocking Performance", printed from <http://iwcs.omnibooksonline.com/data/papers/2010/6_2.pdf> on Aug. 15, 2012.

"Time-Tested Technology for the Most Exacting Standards—Hose extrusion lines", printed from <http://www.kraussmaffei.com/files_db/1294495320_99__15.pdf> on Aug. 23, 2012.

(56) References Cited

OTHER PUBLICATIONS

U.S. Appl. No. 13/623,386, to Boday et al., entitled "Multilayer Hose with Leak Preventative Interfacial Layer Containing Super Absorbent Polymer (SAP)", filed Sep. 20, 2012, assigned to International Business Machines Corporation.

* cited by examiner

FLEXIBLE-TO-RIGID TUBING

CROSS-REFERENCE TO RELATED APPLICATIONS

This patent application is a divisional application of U.S. patent application Ser. No. 13/940,367, filed Jul. 12, 2013, entitled "FLEXIBLE-TO-RIGID TUBING", which is a divisional application of U.S. patent application Ser. No. 12/869,937, filed Aug. 27, 2010, entitled "FLEXIBLE-TO-RIGID TUBING" (now U.S. Pat. No. 8,507,062), each of which is hereby incorporated herein by reference in its entirety.

BACKGROUND OF THE INVENTION

1. Field of Invention

The present invention relates in general to the field of electronic packaging. More particularly, the present invention relates to electronic packaging that removes heat from one or more electronic components using a cooling plate assembly having tubing through which a coolant flows and which is flexible when placed and is then "rigidized" to increase burst strength. The present invention also relates to flexible-to-rigid tubing for use in cooling plate assemblies and other applications.

2. Background Art

Electronic components, such a microprocessors and integrated circuits, must operate within certain specified temperature ranges to perform efficiently. Excessive temperature degrades electronic component functional performance, reliability, and life expectancy. Heat sinks are widely used for controlling excessive temperature. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to enhance heat spreading into the extended area structure. Heat sinks are typically formed of highly conductive metals, such as copper or aluminum. More recently, graphite-based materials have been used for heat sinks because such materials offer several advantages, such as improved thermal conductivity and reduced weight.

High performance computer systems have rapidly migrated toward liquid cooling solutions to effectively remove the massive heat load from the CEC, or central electronics complex. Typically, the CEC of a high performance computer system includes CPUs, RAM and other electronic components that generate copious amounts of heat. Heat is removed from one or more electronic components in the CEC of high performance computer systems using a cooling plate assembly through which a coolant flows. The design of such systems typically calls for flexible tubing incorporating a large number of connections to one or more coldplates/heat sinks.

For example, a plurality of articulated-gap coldplates may be employed in high performance computer systems. Individual articulated-gap coldplates are separately spring-loaded against the top side of each component (or module) to be cooled. These individual articulated-gap coldplates are interconnected with flexible tubing between each coldplate. Such a scheme is disclosed in U.S. Patent Application Publication 2008/0163631 A1, published Jul. 10, 2008, entitled "METHODS FOR CONFIGURING TUBING FOR INTERCONNECTING IN-SERIES MULTIPLE LIQUID-COOLED COLD PLATES", assigned to the same assignee as the present application. While this option allows for mechanically independent attach solutions for each coldplate/component (or module) combination and allows each coldplate to have a relatively small mass, it greatly increases the risk of leaking, given the large number of flexible tube interconnects. The risk of leaking is amplified when the burst strength of the flexible tube interconnects is sacrificed to achieve the flexibility required to route the flexible tube interconnects.

High performance computer systems may also employ a combination of a fixed-gap coldplate and an articulated coldplate. Typically, the fixed-gap coldplate is positioned over electronic components having relatively low power dissipation, and the articulated coldplate is positioned over one or more high power processor components. These coldplates are interconnected with flexible tubing, such as copper tubing with a free-expansion loop. Such a scheme is disclosed in U.S. Patent Application Publication 2009/0213541 A1, published Aug. 27, 2009, entitled "COOLING PLATE ASSEMBLY WITH FIXED AND ARTICULATED INTERFACES, AND METHOD FOR PRODUCING SAME", assigned to the same assignee as the present application. This option allows a minimal number of flexible tube interconnects and thereby decreases the risk of leaking (as compared to solutions that require a large number of flexible tube interconnects). Unfortunately, the risk of leaking nonetheless remains when the burst strength of the flexible tube interconnects is sacrificed to achieve the flexibility required to route the flexible tube interconnects.

The choice of material for making the flexible tube interconnects presents a challenge with respect to ensuring adequate reliability. The tubing material must satisfy two requirements that are in conflict with one another: flexibility (determined as the minimum bend radius prior to kinking) and burst strength. In order to achieve the flexibility required to route the tubing through the CEC, the burst strength is often sacrificed (e.g., the tubing wall strength is reduced). It is desirable to be able to maintain tubing flexibility without sacrificing burst strength.

Therefore, a need exists for an enhanced tubing material for use in cooling plate assemblies and other applications.

SUMMARY OF THE INVENTION

According to the preferred embodiments of the present invention, a cooling plate assembly for transferring heat from electronic components mounted on a circuit board includes a flexible-to-rigid tube through which coolant flows. The flexible-to-rigid tube is flexible when routed and is then rigidized to increase burst strength. In one embodiment, the flexible-to-rigid tube (while in a flexible state) includes a polydimethylsiloxane (PDMS) or other silicone containing pendant or terminal epoxy, vinyl and/or acrylate functional groups and an initiator (e.g., a sulfonium salt photoinitiator, a free radical photoinitiator, or a thermal initiator). In another embodiment, triallyl isocyanurate (TAIC) and an initiator are incorporated into a conventional PVC-based tubing material. The flexible-to-rigid tube changes from a flexible state to a rigid state via formation of a cross-linked network upon exposure to actinic radiation or heat. The flexible-to-rigid tube may be used in cooling plate assemblies and other applications.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1. Overview

In accordance with the preferred embodiments of the present invention, a cooling plate assembly for transferring heat from electronic components mounted on a circuit board includes a flexible-to-rigid tube through which coolant flows. The flexible-to-rigid tube is flexible when routed and is then rigidized to increase burst strength. In one embodiment, the flexible-to-rigid tube (while in a flexible state) includes a polydimethylsiloxane (PDMS) or other silicone containing pendant or terminal epoxy, vinyl and/or acrylate functional groups and an initiator (e.g., a sulfonium salt photoinitiator, a free radical photoinitiator, or a thermal initiator). In another embodiment, triallyl isocyanurate (TAIC) and an initiator are incorporated into a conventional PVC-based tubing material. The flexible-to-rigid tube changes from a flexible state to a rigid state via formation of a cross-linked network upon exposure to actinic radiation or heat. The flexible-to-rigid tube may be used in cooling plate assemblies and other applications.

2. Detailed Description

Figure 1:
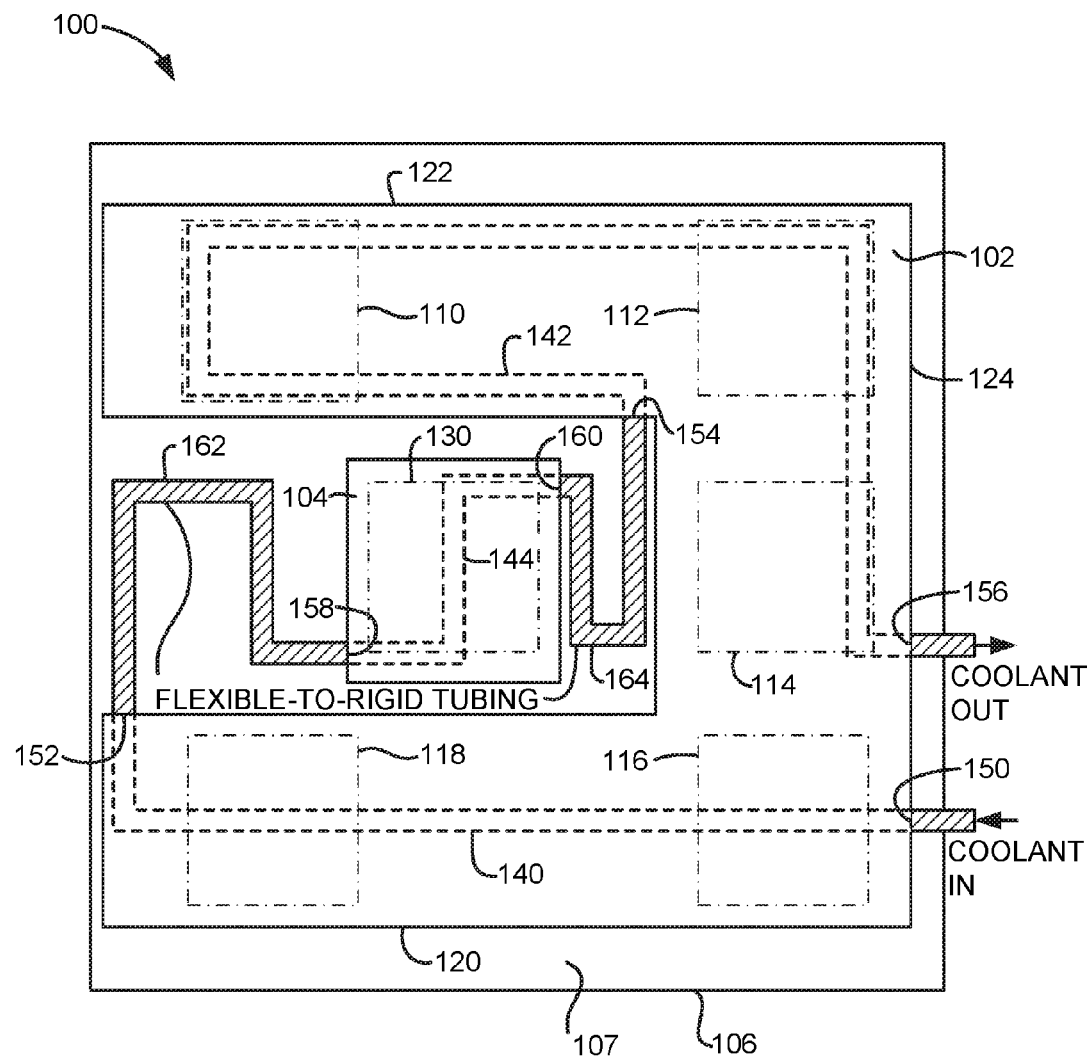
FIG. 1 is a top plan view of a cooling plate assembly having flexible-to-rigid tubing according to the preferred embodiments of the present invention.

Referring now to FIG. 1, there is depicted, in a top plan view, a cooling plate assembly 100 that utilizes one or more flexible-to-rigid tubes 162 and 164 in accordance with the preferred embodiments of the present invention. In the embodiment shown in FIG. 1, the flexible-to-rigid tubes 162 and 164 interconnect a fixed-gap cooling plate 102 (also referred to herein as a "fixed-gap coldplate") and an articulated cooling plate 104 (also referred to herein as an "articulated coldplate" or a "floating coldplate"). The embodiment shown in FIG. 1 employs a combination of a fixed-gap coldplate and an articulated coldplate. This particular type of cooling plate assembly is shown in FIG. 1 for the purpose of illustrating an exemplary application of the present invention. One skilled in the art will appreciate that a flexible-to-rigid tube in accordance with the present invention may be utilized in other cooling plate assemblies (e.g., a cooling plate assembly employing multiple articulated-gap cold plates) and other applications (e.g., re-piping in residential and commercial buildings).

With the exception of the flexible-to-rigid tubes 162 and 164, the cooling plate assembly 100 shown in FIG. 1 is conventional. Specifically, the cooling plate assembly 100 is a modified-version of the cooling plate assembly disclosed in U.S. Patent Application Publication 2009/0213541 A1, published Aug. 27, 2009, entitled "COOLING PLATE ASSEMBLY WITH FIXED AND ARTICULATED INTERFACES, AND METHOD FOR PRODUCING SAME", assigned to the same assignee as the present application, and hereby incorporated herein by reference in its entirety. In the prior art, the flexible tubes used to interconnect the fixed-gap coldplate and the articulated coldplate are typically made of a high thermal conductivity material, such as copper, aluminum, stainless steel, or other metal. Such conventional flexible tubes are each typically fabricated from low modulus metal tubing (e.g., 5-10 mm diameter copper tubing) that is bent to form a free-expansion loop. The free-expansion loop increases the length of the tube and thereby enhances the tube's flexibility as compared to a shorter, more directly routed tube. The free-expansion loop enhances the ability of the tube to accommodate relative movement between the cooling plates (e.g., during attachment of the cooling plates to the printed circuit board) while imparting a relatively low reaction force in response to that relative movement. Typically, brazing is utilized in connecting the conventional flexible tubes to the cooling plates. Unfortunately, the cost of such conventional flexible tubes can be prohibitive in light of the expense of the metal material, the metal bending process used to form the free-expansion loop, and the brazing process used for connection.

Another solution is to achieve the requisite flexibility by reducing the tubing wall strength (e.g., using a polymer tubing material rather than a metal tubing material). Heretofore, this solution achieved the requisite flexibility but only at the expense of sacrificing burst strength. Flexible-to-rigid tubing in accordance to the present invention solves this problem. Flexible-to-rigid tubing is flexible when routed and is then rigidized to increase burst strength. Also, flexible-to-rigid tubing is less expensive to implement because it does requires neither a metal bending process nor a brazing process for connection.

The transition from flexible to rigid tubing is accomplished by crosslinking the base polymer after the tubing has been routed through the CEC. Crosslinking is accomplished by use of pendant and/or terminal groups off the main polymer chain which can be crosslinked via various chemistry approaches.

The flexibility of tubing is typically measured as the minimum bend radius prior to kinking. For example, an exemplary flexible-to-rigid tube having an outside diameter (O.D.) of ¼ inch and a wall thickness of 1/16 inch, may have a flexibility (minimum bend radius) of 1 inch in its flexible state. The burst strength of tubing is typically measured as a maximum working pressure at a given temperature. For example, the exemplary flexible-to-rigid tube having an outside diameter (O.D.) of ¼ inch and a wall thickness of 1/16 inch, may have a burst strength (maximum working pressure) of 60 PSI at 160° F. in its rigid state (and 40 PSI at 160° F. in its flexible state). The particular parameter values set forth in this example are for purposes of illustration, not limitation.

In the embodiment illustrated in FIG. 1, the fixed-gap cooling plate 102 is "fixedly" mounted to a printed circuit board (PCB) 106 using a relatively thick compliant thermal interface material, while the articulated cooling plate 104 is gimbal-mounted to the PCB 106 using a relatively high performance interface with low thickness and high contact pressure provided by a spring loading mechanism. One or more electronic components to be cooled by the fixed-gap cooling plate 102 is/are mounted on the top surface 107 of the PCB 106, as is one or more electronic components to be cooled by the articulated cooling plate 104.

In the embodiment shown in FIG. 1, the fixed-gap cooling plate 102 provides cooling for electronic components 110, 112, 114, 116 and 118 (shown as phantom lines in FIG. 1), which may be lower power components, such as low power processors, field programmable gate arrays (FPGAs), memory arrays, modules with one or more chips, and the like. In the embodiment shown in FIG. 1, the fixed-gap cooling plate 102 has a generally U-shaped configuration that includes two leg portions 120, 122 each extending from a base portion 124. One skilled in the art will appreciate that the configuration of the fixed-gap cooling plate 102 shown in FIG. 1 is exemplary and that a fixed-gap cooling plate may be configured to have any shape. Likewise, a fixed-gap cooling plate may provide cooling for any number and any type of electronic components. Typically, the electronic components cooled by the fixed-gap cooling plate 102 have relatively low power dissipation as compared to the relatively high power dissipation of the one or more electronic components cooled by the articulated cooling plate 104, i.e., electronic component 130.

The electronic components cooled by the fixed-gap cooling plate 102 are typically in thermal contact with the fixed-gap cooling plate 102 through a compressive pad thermal interface material (TIM) (not shown). The compressive pad TIM may be a re-usable elastomerically conformable type, or it may be pre-cured or, alternatively, may be cured in-situ. For example, the compressive pad TIM may be provided by mixing a multi-part liquid material and then applying the mixture to the fixed-gap cooling plate 102 and/or the electronic components. An example of a suitable composition for the compressive pad TIM is a fiberglass reinforced, thermally conductive silicone gel pad (commercially available from Dow Corning Corporation, Midland, Mich.).

In the embodiment shown in FIG. 1, the articulated cooling plate 104 has a substantially rectangular configuration and is substantially surrounded by the fixed-gap cooling plate 102. That is, the articulated cooling plate 104 is positioned between the leg portions 120, 122 of the fixed-gap cooling plate 102 and adjacent the base portion 124 of the fixed-gap cooling plate 102. One skilled in the art will appreciate that the configuration of the articulated cooling plate 104 is exemplary, as is the positioning of the articulated cooling plate 104 relative to the fixed-gap cooling plate 102, and that an articulated cooling plate may be configured to have any shape and position relative to the fixed-gap cooling plate. The articulated cooling plate 104 typically provides cooling for a high power electronic component 130 (shown as phantom lines in FIG. 1), which is typically a high power processor, a module with one or more high power processor chips, and the like having a relatively high power dissipation. One skilled in the art will appreciate that an articulated cooling plate may provide cooling for any number and any type of electronic components.

In the embodiment shown in FIG. 1, a single coolant channel connects the fixed-gap cooling plate to the articulated cooling plate. In the embodiment shown in FIG. 1, the fixed-gap cooling plate 104 includes thermal dissipation channels 140 and 142, while the articulated cooling plate 106 includes a thermal dissipation channel 144. The thermal dissipation channel 140 extends through a lower-side (as viewed in FIG. 1) of the fixed-gap cooling plate 102 from an inlet port 150 at the base portion 124 to an outlet port 152 at the leg portion 120. The thermal dissipation channel 142 extends through an upper-side (as viewed in FIG. 1) of the fixed-gap cooling plate 102 from an inlet port 154 at the leg portion 122 to an outlet port 156 at the base portion 124. The thermal dissipation channel 144 extends through the articulated cooling plate 104 from an inlet port 158 to an outlet port 160.

In the embodiment shown in FIG. 1, a flexible-to-rigid tube 162 interconnects the outlet port 152 of the thermal dissipation channel 140 of the fixed-gap cooling plate 102 to the inlet port 158 of the thermal dissipation channel 144 of the articulated cooling plate 104. Similarly, a flexible-to-rigid tube 164 interconnects the outlet port 160 of the thermal dissipation channel 144 of the articulated cooling plate 104 to the inlet port 154 of the thermal dissipation channel 142 of the fixed-gap cooling plate 102. In accordance with the preferred embodiments of the present invention, the flexible-to-rigid tubes 162 and 164 are routed while in a flexible state and are then "rigidized" to increase burst strength. The flexible-to-rigid tubes 162 and 164, while in the flexible state, are sufficiently flexible to allow the tubes to be readily routed between and connected to the input and output ports of the cooling plates 102 and 104. Preferably, the flexible-to-rigid tubes 162 and 164 are changed from the flexible state to the rigid state via formation of a cross-linked network upon exposure of the flexible-to-rigid tubes 162 and 164 to actinic radiation or heat.

The flexible-to-rigid tubes 162 and 164, in accordance with the preferred embodiments of the present invention, include at least one rigidizable material. In one embodiment, described below with reference to FIG. 3, the flexible-to-rigid tubes 162 and 164 include a polydimethylsiloxane (PDMS) and a sulfonium salt catalyst. In another embodiment, described below with reference to FIG. 4, the flexible-to-rigid tubes 162 and 164 include triallyl isocyanurate (TAIC) and an initiator (e.g., a free radical photoinitiator or a thermal initiator) incorporated into a PVC-based tubing material. The flexible-to-rigid tubes 162 and 164 change from a flexible state to a rigid state via formation of a cross-linked network upon exposure to actinic radiation or heat.

In the embodiment shown in FIG. 1, the flexible-to-rigid tubes 162 and 164 are routed to form a free-expansion loop. The free-expansion loop increases the length of the tube and thereby enhances the tube's flexibility as compared to a shorter, more directly routed tube. The free-expansion loop enhances the ability of the tube to accommodate relative movement between the cooling plates while imparting a relatively low reaction force in response to that relative movement.

The flexible-to-rigid tubes 162 and 164 typically have an outer diameter of 5-10 mm and a wall thickness of 1-2 mm, but may have any suitable outside diameter and wall thickness.

The flexible-to-rigid tubes 162 and 164 may be connected to the fixed-gap cooling plate 102 and the articulated cooling plate 104 using any suitable conventional fastening technique. For example, conventional barbed insert fittings may be used. Single barb insert fittings, for instance, have a land behind the barb that allows a clamp to be fastened over the tubing. In any event, the fastening technique preferably also serves to effectively seal the tubes relative to the cooling plates to prevent coolant leaks.

The single barb insert fitting is an example of a suitable conventional fastening technique that may be utilized in connecting the flexible-to-rigid tubes to the cooling plates. For example, four single barb insert fittings (not shown) may be inserted and sealed into the outlet port 152 of the fixed-gap cooling plate 102, the inlet port 158 of the articulated cooling plate 104, the outlet port 160 of the articulated cooling plate 104, and the inlet port 154 of the fixed-gap cooling plate 102 using conventional techniques. Then, the ends of the flexible-to-rigid tube 162 may be slid over and in turn clamped to (e.g., by tightening a clamp over each end of the tube) two single barb insert fittings respectively provided on the outlet port 152 of the thermal dissipation channel 140 of the fixed-gap cooling plate 102 and the inlet port 158 of the thermal dissipation channel 144 of the articulated cooling plate 104. Similarly, the ends of the flexible-to-rigid tube 164 may be slid over and in turn clamped to (e.g., by tightening a clamp over each end of the tube) two single barb insert fittings respectively provided on the outlet port 160 of the thermal dissipation channel 144 of the articulated cooling plate 104 and the inlet port 154 of the thermal dissipation channel 142 of the fixed-gap cooling plate 102.

Typically, the fixed-gap cooling plate 102 and the articulated cooling plate 104 are made of a high thermal conductivity material, such as copper, aluminum, stainless steel, or other metal. In some embodiments, the fixed-cooling plate 102 and/or the articulated cooling plate 104 may be made of silicon (e.g., single-crystal silicon or polycrystalline silicon) to match the coefficient of thermal expansion of the silicon chips being cooled.

The fixed-gap cooling plate 102 and the articulated cooling plate 104 may have a multi-part construction to facilitate the formation of the thermal dissipation channels 140, 142 and 144. For example, each of the cooling plates may be constructed by joining a top plate to a bottom plate, at least one of which has at least a portion of one or more thermal dissipation channels formed on a surface thereof at the interface between top plate and the bottom plate. The top plate and the bottom plate may be joined together using any suitable conventional fastening technique such as brazing, soldering, diffusion bonding, adhesive bonding, etc. For example the top plate may be bonded to the bottom plate using a silver filled epoxy, filled polymer adhesive, filled thermoplastic or solder, or other thermally conductive bonding material. The fastening technique preferably also serves to effectively seal the plates together to prevent coolant leaks.

The thermal dissipation channels may be formed on the surface of either or both the top plate and the bottom plate by any suitable conventional technique such as routing, sawing or other milling technique, or by etching.

In lieu of a multi-part construction, the fixed-gap cooling plate 102 and/or the articulated cooling plate 104 may have a one-piece construction. For example, the thermal dissipation channels may be formed in the fixed-gap cooling plate 102 and/or the articulated cooling plate 104 through a milling operation (e.g., drilling).

Figure 2:
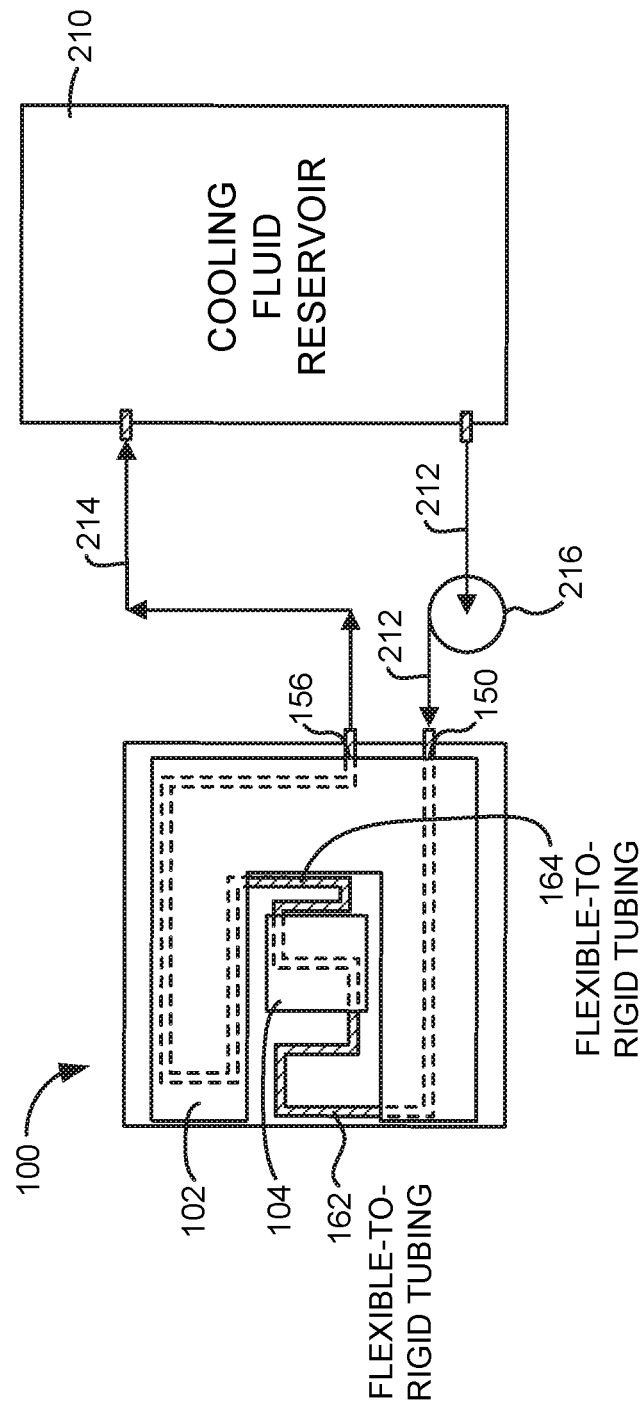
FIG. 2 is a top plan view of a cooling plate assembly having a fixed-gap cooling plate and an articulated cooling plate interconnected with flexible-to-rigid tubing and in fluid communication with a reservoir containing cooling fluid according to the preferred embodiments of the present invention.

FIG. 2 is a top plan view of a cooling plate assembly 100 having a fixed-gap cooling plate 102 and an articulated cooling plate 104 interconnected with flexible-to-rigid tubing 162 and 164 and in fluid communication with a reservoir 210 containing cooling fluid according to the preferred embodiments of the present invention. A cooling fluid is preferably pumped from thermal reservoir 210 through a supply conduit 212 to inlet port 150 of the cooling plate assembly 100, where the cooling fluid picks up heat as it travels through thermal dissipation channels of the fixed-gap cooling plate 102 and the articulated cooling plate 104. Then, the cooling fluid is exhausted from outlet port 156 of the cooling plate assembly 100 through an exhaust conduit 214 and returns to thermal reservoir 210. A pump 216 is preferably provided to force the cooling fluid through the recirculation loop. Prior to recirculating the cooling fluid through the recirculation loop, it may be desirable to cool the cooling fluid. For example, the cooling fluid may be cooled in the reservoir or elsewhere using a heat exchanger, waterfall, radiator, or other conventional cooling mechanism. The cooling fluid may be any suitable coolant, for example, an inert perfluorocarbon fluid, such as 3M Fluorinert™ commercially available from 3M Company, St. Paul, Minn. Other suitable coolants include, but are not limited to, water, ethylene glycol, ethylene glycol/water mixture, polyalphaolefin (PAO), ammonia, methanol, nitrogen, and the like.

Supply conduit 212 and exhaust conduit 214 are respectively attached to inlet port 150 and outlet port 156 of the cooling plates assembly 100 using any suitable conventional fastening technique, such as by inserting and sealing tubular fittings into inlet port 150 and outlet port 156, and then mating supply conduit 212 and exhaust conduit 214 over the tubular fittings to provide a tight seal. Supply conduit 212 and exhaust conduit 214 may be rubber, metal or some other suitable material that is compatible with the coolant. The supply conduit 212 and/or the exhaust conduit 214 may be flexible-to-rigid tubing.

In general, the rate of heat transfer can be controlled by using various thermal transport media in the internal structure of the cooling plate assembly 100. For example, the rate of heat transfer can be controlled by varying the composition and/or the flow rate of the cooling fluid. Also, the rate of heat transfer is a function of the configuration of the thermal dissipation channels within the cooling plate assembly 100.

Figure 3:
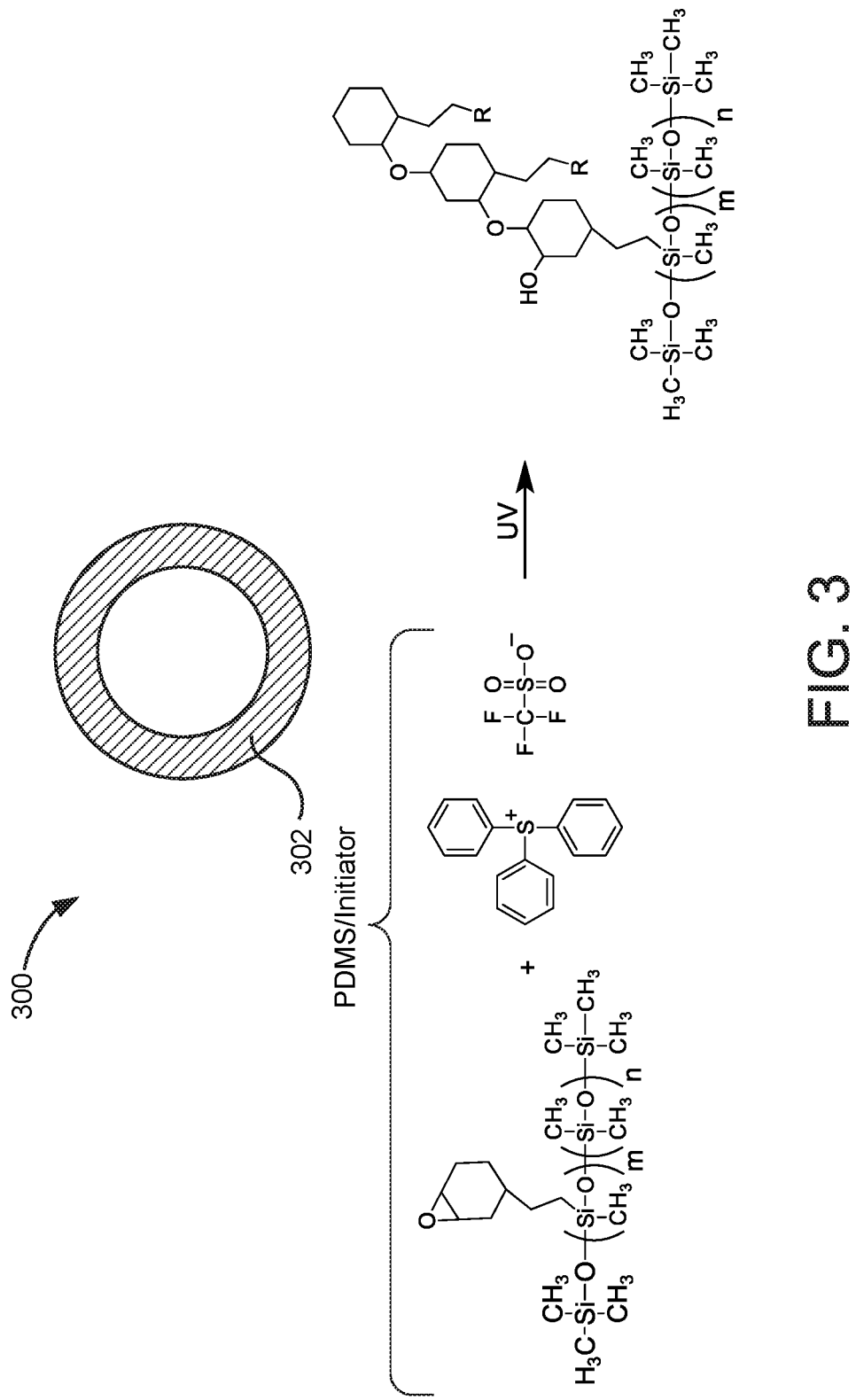
FIG. 3 is cross-sectional view of a flexible-to-rigid tube embodiment of the present invention.

FIG. 3 is cross-sectional view of a flexible-to-rigid tube 300 according to an embodiment of the present invention. The flexible-to-rigid tube 300 shown in FIG. 3 may correspond to one or more of the flexible-to-rigid tubes 162 and 164 shown in FIGS. 1 and 2. In the embodiment illustrated in FIG. 3, the flexible-to-rigid tube 300 is silicone based. Silicone tubing is an industry standard flexible tubing, often with a minimum bend radius less than 0.5 inch. Unfortunately, to achieve such flexibility, the burst strength of conventional silicone tubing is typically marginal. Conventional silicone tubing typically comprises polydimethylsiloxane (PDMS). Accordingly, PDMS is used in the embodiment illustrated in FIG. 3. However, one skilled in the art will appreciate that other silicones may be used in accordance with the present invention and that this embodiment is not limiting. Numerous examples of silicone (PDMS and non-PDMS) chains containing pendant or terminal epoxy, vinyl and acrylate functional groups are described in "Reactive Silicones: Forging New Polymer Links", Gelest, Inc., Morrisville, Pa., Mar. 25, 2009, which is hereby incorporated herein by reference in its entirety.

PDMS has the chemical formula $CH_3[Si(CH_3)_2O]_nSi(CH_3)_3$, where n is the number of repeating monomer $[Si(CH_3)_2O]$ units. The chemical structure of PDMS is shown below.

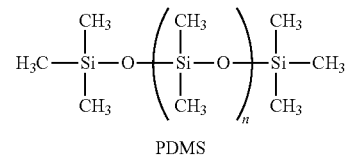

PDMS

PDMS belongs to a group of polymeric organosilicon compounds (i.e., organic compounds containing carbon silicon bonds) that are commonly referred to as silicones (also referred to as polymerized siloxanes or polysiloxanes). As illustrated in FIG. 3, in its flexible state, the flexible-to-rigid tube 300 includes a single layer 302 incorporating PDMS (having at least one pendant or terminal crosslinkable group) and an initiator (e.g., a photoinitiator).

By incorporating either a pendant crosslinkable group in the PDMS chain (e.g., epoxycyclohexylethylmethylsiloxane)-dimethylsiloxane copolymer as illustrated in FIG. 3) of layer 302, along with a sulfonium salt catalyst (e.g., triphenylsulfonium triflate as illustrated in FIG. 3) or any other suitable photoinitiator (e.g., an onium photoinitiator), the PDMS can be crosslinked upon exposure to actinic radiation. Upon crosslinking, the flexural modulus of the flexible-to-rigid tubing will increase as will the burst strength (maximum working pressure). The reaction for the silicone-based embodiment illustrated in FIG. 3 is set forth in Reaction 1 below. The constituent reactants in Reaction 1, i.e., (epoxycyclohexylethylmethylsiloxane)-dimethylsiloxane copolymer and triphenylsulfonium triflate, are commercially available.

Reaction 1

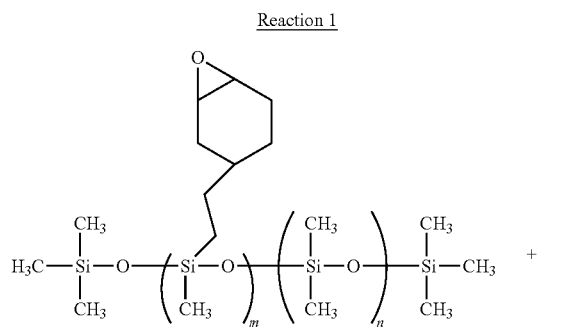

(EpoxyCyclohexylEthylMethylSiloxane)-DimethylSiloxane

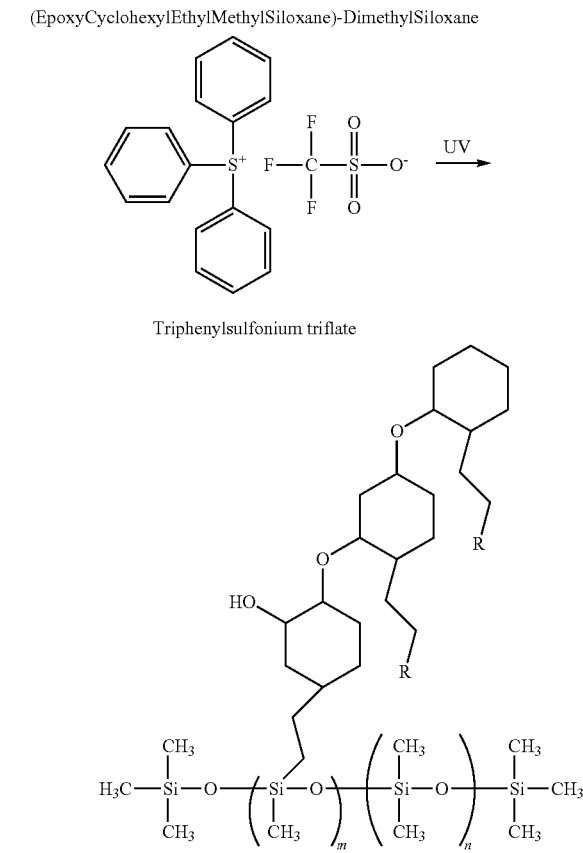

Triphenylsulfonium triflate

For the sake of clarity, the R group in the Reaction 1 represents the PDMS backbone. The extent of crosslinking illustrated in Reaction 1 is exemplary. As illustrated in Reaction 1, three of the PDMS chains are crosslinked. However, one skilled in the art will appreciate that any suitable extent of crosslinking may be utilized in accordance with the present invention. The extent of crosslinking is a significant factor in the flexural modulus of the flexible-to-rigid tube in the rigid state.

The flexible-to-rigid tubing 300 is routed into place while still in the flexible state. UV light from a conventional portable UV light source, for example, is then used to expose the flexible-to-rigid tubing 300. Exposure to the UV light "rigidizes" the flexible-to-rigid tubing 300 (i.e., increases the flexural modulus of the flexible-to-rigid tubing 300) and increases its burst strength. Upon exposure, the triphenylsulfonium salt liberates acid (H+) via well established chemistry. The pendant cyclohexylepoxy rapidly reacts with the proton via cationic ring-opening polymerization to result in a crosslinked network. Depending on the desired flexural modulus, the concentration of pendant epoxy groups and photoinitiator can be tailored to the specific application.

The silicone-based embodiment illustrated in FIG. 3 is exemplary. Many variations are possible. For example, one skilled in the art will appreciate that a terminal crosslinkable group may be incorporated in the PDMS chain (e.g., 3-glycidoxypropyl terminated PDMS) in lieu of, or in addition to, a terminal crosslinkable group as shown in FIG. 3. The chemical structure of an exemplary commercially available 3-glycidoxypropyl terminated PDMS suitable for use in the present invention is shown below.

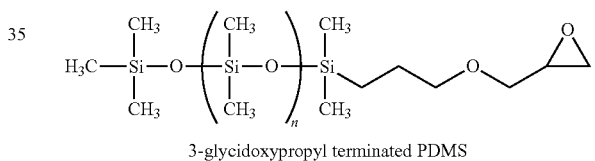

3-glycidoxypropyl terminated PDMS

Additionally, PDMS chains containing pendant or terminal functional groups such as vinyl and acrylate groups can be used to produce a flexible-to-rigid tube in accordance with the present invention, in a process similar to that described above for PDMS chains containing pendent epoxies. However, the sulfonium salt photoinitiator used in Reaction 1 would be replaced by a free radical photoinitiator such as benzoin, or a thermal initiator such as azobisisobutyronitrile or benzoyl peroxides (e.g., dibenzoylperoxide and bis(dichlorobenzoyl)peroxide).

Commercially available examples of PDMS chains containing pendant or terminal vinyl and acrylate functional groups abound. Examples suitable for use in the present invention are set forth below, but one skilled in the art will appreciate that other PDMS chains and other silicone chains containing pendant or terminal vinyl and acrylate functional groups may be used and that the examples set forth are not limiting. Numerous examples of silicone (PDMS and non-PDMS) chains containing pendant or terminal vinyl and acrylate functional groups (e.g., vinyl Q resins and vinyl T resins) are described in "Reactive Silicones: Forging New Polymer Links", Gelest, Inc., Morrisville, Pa., Mar. 25, 2009, which is incorporated herein by reference in its entirety. The chemical structure of an exemplary commercially available vinyl terminated PDMS and an exemplary commercially available vinyl terminated diphenylsiloxane- PDMS copolymer suitable for use in the present invention are shown below, as well as an exemplary commercially available vinylmethylsiloxane-PDMS copolymer with pendant vinyl group.

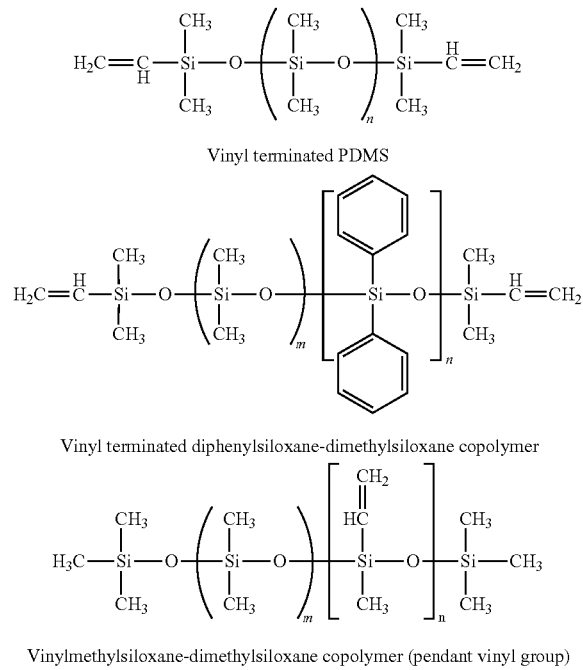

Vinyl terminated PDMS

Vinyl terminated diphenylsiloxane-dimethylsiloxane copolymer

Vinylmethylsiloxane-dimethylsiloxane copolymer (pendant vinyl group)

The chemical structure of methacrylate and acrylate functional siloxanes (generic structure) suitable for use in the present invention is shown below, as well as an exemplary commercially available (methacryloxypropyl)methylsiloxane-PDMS copolymer with a pendant methacrylate group.

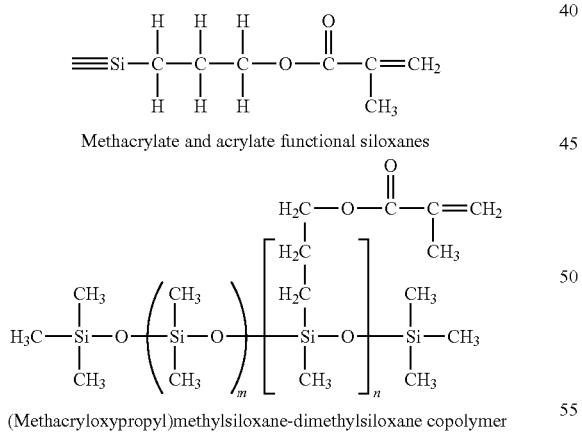

Methacrylate and acrylate functional siloxanes (Methacryloxypropyl)methylsiloxane-dimethylsiloxane copolymer While PDMS is the most common polysiloxane, silicone based embodiments of the present invention are not limited thereto. As mentioned earlier, other silicone chains containing pendant or terminal vinyl and acrylate functional groups may be used in the present invention. Examples of such silicones are vinyl Q resins and vinyl T resins. Vinyl Q resins are typically clear reinforcing additives for addition cure elastomers. Vinyl T resins are T-structure polymers (i.e., contain multiple branch points) that have a vinyl branch point and/or a vinyl branch terminus. (T resins contain silicon species which contain three oxygens and an R group. Q resins contain a silicon species which contains four oxygens. Not every silicon species in the resin contains that formula but a majority does.) The chemical structure of an exemplary commercially available vinyl Q resin suitable for use in the present invention is shown below, as well as an exemplary commercially available vinyl T resin having a vinyl branch point and an exemplary commercially available vinyl T resin having a vinyl branch terminus.

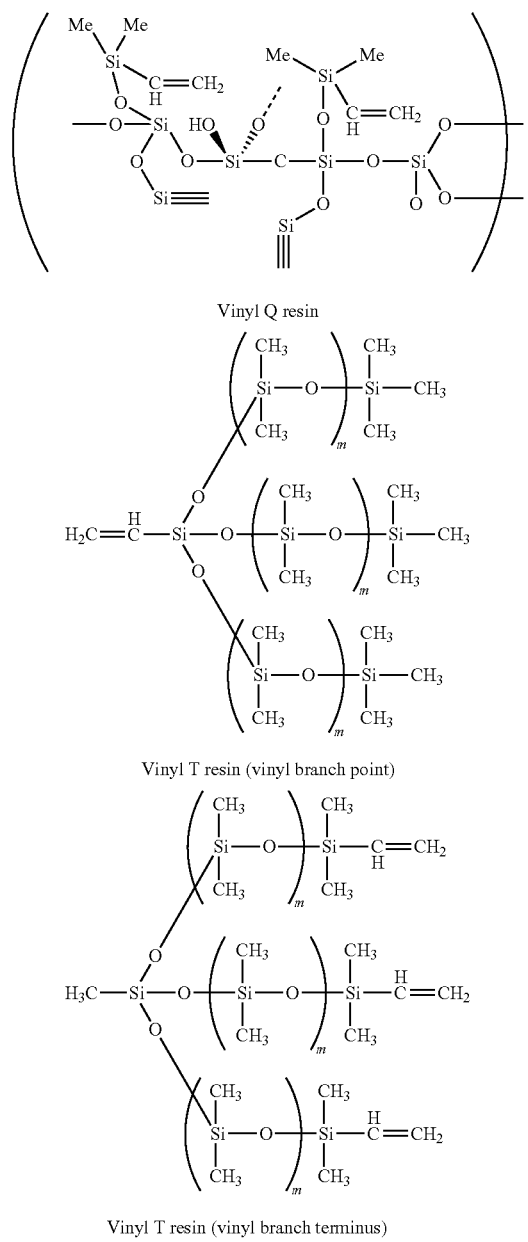

Vinyl Q resin

Vinyl T resin (vinyl branch point)

Vinyl T resin (vinyl branch terminus)

The burst strength of the tubing could be even further increased through the addition of triallyl isocyanurate (TAIC), a common hardener used in laminate manufacturing of printed circuit boards. The chemical structure of TAIC is shown in Reaction 2, below. In this case, once the tubing is routed into place, the assembly would be subjected to elevated temperature selected based upon the free radical half life. Polymerization of the flexible-to-rigid tubing ensues and the flexural modulus and burst strength dramatically increases.

Another embodiment of the present invention involves modification of conventional flexible tubing, such as compounded PVC tubing, to incorporate TAIC and an initiator. The most common form of flexible tubing is compounded PVC tubing because it imparts chemical resistance and flexibility. Compounded PVC tubing is available from, for example, Saint-Gobain Performance Plastics, Akron, Ohio under the tradename TYGON® Inert Tubing. Incorporation of TAIC/initiator into the compounded PVC in accordance with the present invention results in a PVC-based tubing material that can be "rigidized" by heat (or thermal energy).

Figure 4:
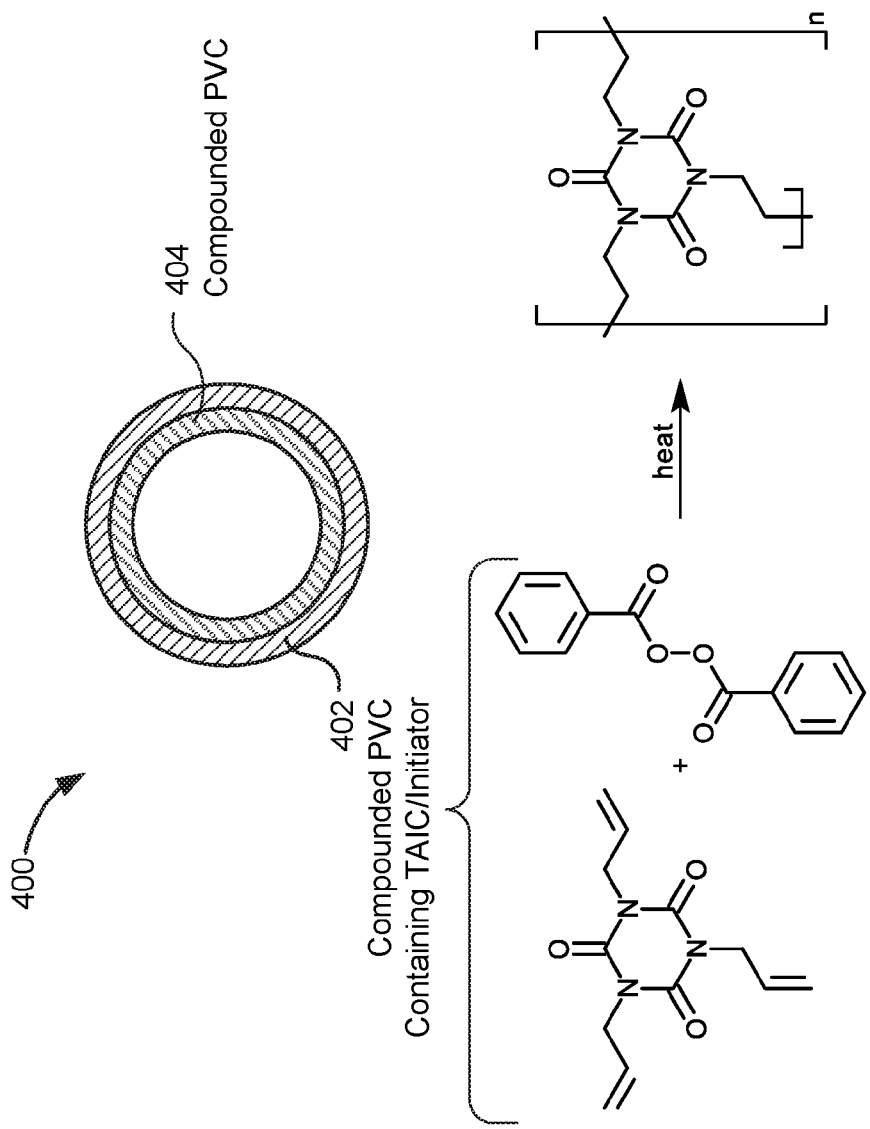
FIG. 4 is cross-sectional view of a multi-layer flexible-to-rigid tube embodiment of the present invention.

FIG. 4 is cross-sectional view of a multi-layer flexible-to-rigid tube 400 according to another embodiment of the present invention. The multi-layer flexible-to-rigid tube 400 shown in FIG. 4 may correspond to one or more of the flexible-to-rigid tubes 162 and 164 shown in FIGS. 1 and 2. In the embodiment illustrated in FIG. 4, the multi-layer flexible-to-rigid tube 400 is PVC based. The multi-layer flexible-to-rigid tube 400 has a crosslinkable, compounded PVC jacket 402 extruded over a conventional, compounded PVC inner liner 404. In accordance with this embodiment of the present invention, conventional multi-layer tubing is modified to incorporate triallyl isocyanurate (TAIC) and an initiator into the compounded PVC jacket 402. For example, the multi-layer flexible-to-rigid tube 400 may be a modified version of TYGON® Formulation SE-200 Inert Tubing, available from Saint-Gobain Performance Plastics, Akron, Ohio, which is modified in accordance with the present invention to incorporate TAIC and an initiator into the compounded PVC jacket.

The multi-layer flexible-to-rigid tube 400 is formed by extruding the crosslinkable, compounded PVC jacket 402 material over the conventional, compounded PVC inner liner 404. The extrusion process is conventional. Because the crosslinkable, compounded PVC jacket 402 is essentially identical to the conventional, compounded PVC inner liner 404, the flexibility of the tubing is retained. The TAIC/initiator concentration can be tailored at will, but 10 wt % will provide a noticeable increase in burst pressure. Preferably, the initiator is a free radical photoinitiator such as benzoin, or a thermal initiator such as azobisisobutyronitrile or benzoyl peroxides (e.g., dibenzoylperoxide and bis(dichlorobenzoyl)peroxide). Because TAIC is a liquid monomer, even greater concentrations will not degrade the flexibility. Once the multi-layer flexible-to-rigid tube 400 is positioned as desired, either UV or thermal energy (depending on the type of initiator selected) crosslinks the TAIC into a hard, intractable resin thereby increasing the modulus and burst strength.

The reaction for the PVC-based embodiment illustrated in FIG. 4 is set forth in Reaction 2 below. The constituent reactants in Reaction 2, i.e., TAIC and dibenzoylperoxide (i.e., the exemplary initiator selected in this embodiment), are commercially available. Other suitable initiators for use with TAIC include, but are not limited to, Micheler's ketone or any number of the various Ciba® IRGACURE® photoinitiators (available from Ciba Specialty Chemicals, Basel, Switzerland, now part of BASF), which crosslink the TAIC in the crosslinkable, compounded PVC jacket 402 upon exposure to actinic radiation.

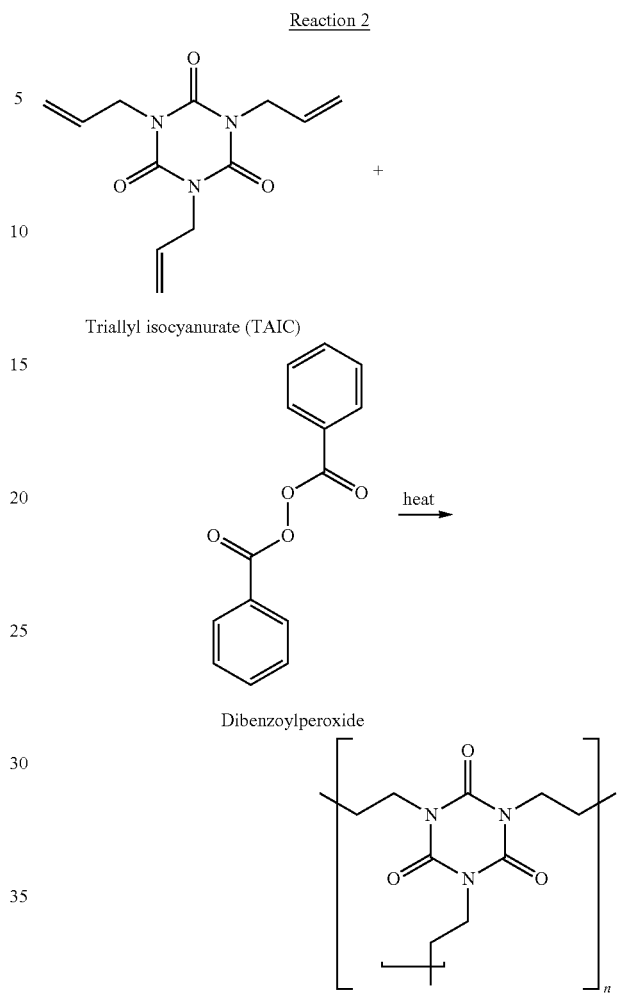

In Reaction 2, the extent of crosslinking is represented by n. One skilled in the art will appreciate that any suitable extent of crosslinking may be utilized in accordance with the present invention. The extent of crosslinking is a significant factor in the flexural modulus of the multi-layer flexible-to-rigid tube 400 in the rigid state.

Figure 5:
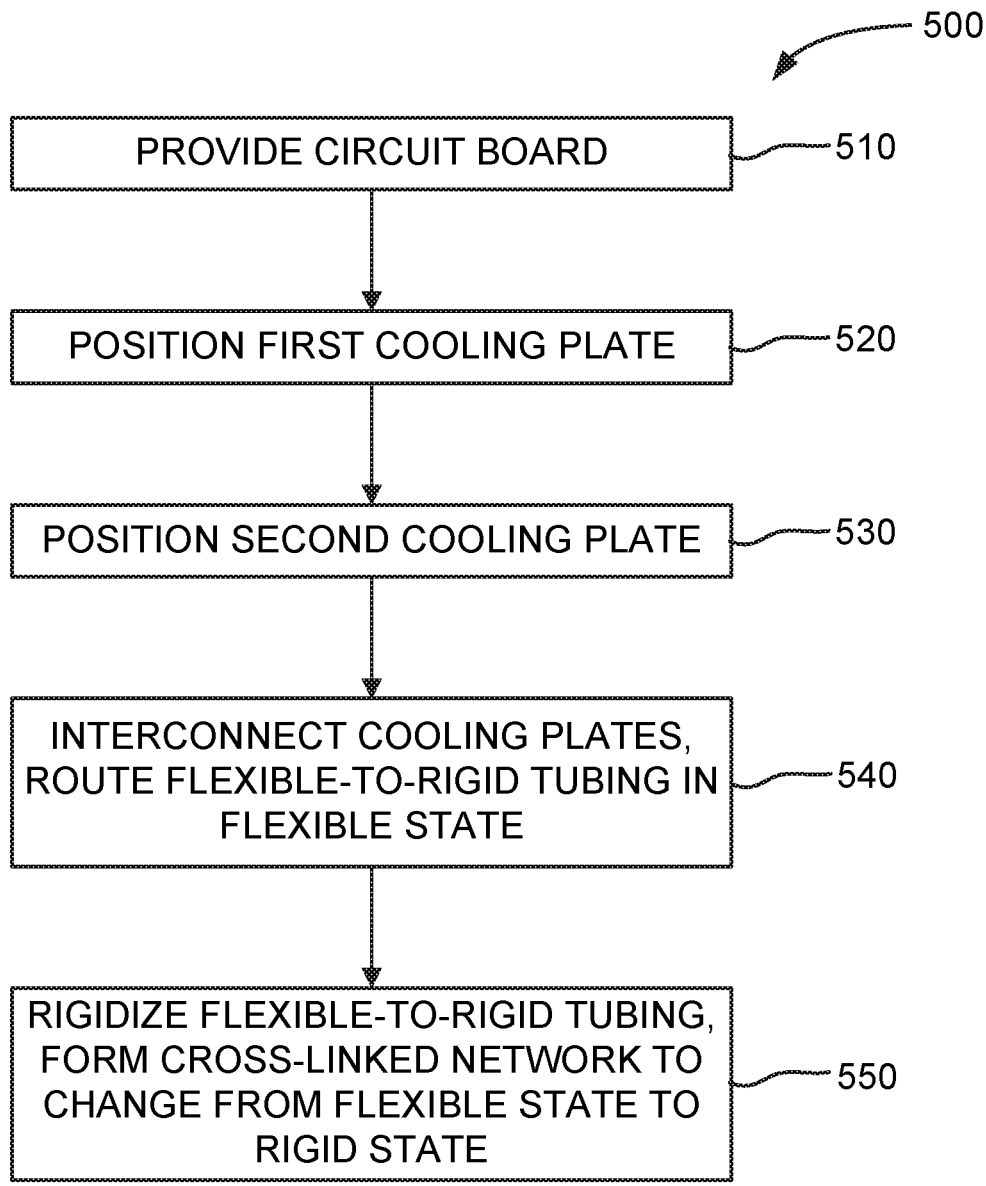
FIG. 5 is a flow diagram of a method for installing flexible-to-rigid tubing according to the preferred embodiments of the present invention.

FIG. 5 is a flow diagram of a method 500 for installing flexible-to-rigid tubing according to the preferred embodiments of the present invention. The method 500 sets forth the preferred order of the steps. It must be understood, however, that the various steps may occur at any time relative to one another. A circuit board is provided on which electronic components are mounted (step 510). This step is conventional. For example, the circuit board referred to in method 500 may be the PCB 106 (FIG. 1), on which are mounted a high power electronic component 130 and low power electronic components 110, 112, 114, 116 and 118. This step is conventional.

A first cooling plate having a thermal dissipation channel extending through a portion thereof is positioned over and in thermal contact with at least one electronic component mounted on the circuit board (step 520). For example, the first cooling plate referred to in method 500 may be the fixed-gap cooling plate 102 (FIG. 1), through which extend thermal dissipation channels 140 and 142. In this case, step 520 is performed by attaching the fixed-gap cooling plate 102 over and in thermal contact with the low power electronic components 110, 112, 114, 116 and 118 mounted on a top surface of the PCB 106. Step 520 may also include interposing a compressive pad TIM between the fixed-gap cooling plate 102 and the low power electronic components 110, 112, 114, 116 and 118. This step is conventional.

A second cooling plate having a thermal dissipation channel extending through a portion thereof is positioned over and in thermal contact with at least one electronic component mounted on the circuit board (step 530). For example, the second cooling plate referred to in method 500 may be the articulated cooling plate 104 (FIG. 1), through which extends thermal dissipation channel 144. In this case, step 530 is performed by attaching the articulated cooling plate 102 over and in thermal contact with the high power electronic component 130 mounted on a top surface of the PCB 106. Step 530 may also include actuating a mechanical attach system, such as a conventional post/spring-plate type clamping mechanism, to provide a spring-loading force that biases the articulated cooling plate 104 in thermal contact with the high power electronic component 130. This step is conventional.

The method 500 continues by interconnecting the thermal dissipation channel of the first cooling plate and the thermal dissipation channel of the second cooling plate using a flexible-to-rigid tube (step 540). Step 540 includes routing the flexible-to-rigid tube in a flexible state between the thermal dissipation channel of the first cooling plate and the thermal dissipation channel of the second cooling plate.

For example, the flexible-to-rigid tube referred to in method 500 may be the flexible-to-rigid tubing 162 and 164 (FIG. 1). The flexible-to-rigid tubing 162 and 164 may be connected to the fixed-gap cooling plate 102 and the articulated cooling plate 104 using any suitable conventional fastening technique. For example, conventional single barb insert fittings may be utilized in connecting the flexible-to-rigid tubing 162 and 164 to the cooling plates 102 and 104. If conventional single barb insert fittings are used, the cooling plate 102 would include two single barb insert fittings respectively inserted and sealed into the outlet port 152 and the inlet port 154. Similarly, the articulated cooling plate 104 would include two single barb insert fittings respectively inserted and sealed into the inlet port 158 and the outlet port 160.

In one embodiment, the flexible-to-rigid tube (while in a flexible state) includes a polydimethylsiloxane (PDMS) or other silicone containing pendant or terminal epoxy, vinyl and/or acrylate functional groups and an initiator (e.g., a sulfonium salt photoinitiator, a free radical photoinitiator, or a thermal initiator). In another embodiment, triallyl isocyanurate (TAIC) and an initiator are incorporated into a conventional PVC-based tubing material.

During step 540, the ends of the flexible-to-rigid tube 162 may be slid over and in turn clamped to (e.g., by tightening a clamp over each end of the tube) two single barb insert fittings respectively provided on the outlet port 152 of the thermal dissipation channel 140 of the fixed-gap cooling plate 102 and the inlet port 158 of the thermal dissipation channel 144 of the articulated cooling plate 104. Also during step 540, the ends of the flexible-to-rigid tube 164 may be slid over and in turn clamped to (e.g., by tightening a clamp over each end of the tube) two single barb insert fittings respectively provided on the outlet port 160 of the thermal dissipation channel 144 of the articulated cooling plate 104 and the inlet port 154 of the thermal dissipation channel 142 of the fixed-gap cooling plate 102.

Next, the method 500 continues by rigidizing the flexible-to-rigid tube (step 550). Step 550 is accomplished through the formation of a cross-linked network to change the flexible-to-rigid tubing 162 and 164 from the flexible state to a rigid state upon exposure to actinic radiation or heat (depending on the type of initiator selected). For example, UV light from a conventional portable UV light source may be used to expose the flexible-to-rigid tubing 162 and 164. In this example, exposure to the UV light "rigidizes" the flexible-to-rigid tubing 162 and 164 (i.e., increases the flexural modulus of the flexible-to-rigid tubing 162 and 164) and increases its burst strength.

In an alternative example, thermal energy (e.g., absorbed from a fluid pumped through the tubing, preferably at low pressure) may be used to expose the flexible-to-rigid tubing 162 and 164. In this alternative example, exposure to the thermal energy "rigidizes" the flexible-to-rigid tubing 162 and 164 (i.e., increases the flexural modulus of the flexible-to-rigid tubing 162 and 164) and increases its burst strength.

One skilled in the art will appreciate that many variations are possible within the scope of the present invention. For example, the flexible-to-rigid tubing in accordance with the present invention may be utilized in applications beyond cooling plate assemblies in industries such as: the automotive industry (for applications such as interconnecting components for engine cooling); the food and beverage industry (for applications such as beverage dispensing/vending); and the building industry (for applications such as re-piping in residential and commercial buildings). Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A method of utilizing a flexible-to-rigid tube for interconnecting an outlet port of a first component and an inlet port of a second component, comprising the steps of:
routing the flexible-to-rigid tube in a flexible state, wherein a first end of the flexible-to-rigid tube is configured to be slid over and clamped to a tubular fitting that defines the outlet port of the first component, wherein a second end of the flexible-to-rigid tube is configured to be slid over and clamped to a tubular fitting that defines the inlet port of the second component, and wherein the routing step includes routing the flexible-to-rigid tube between the outlet port of the first component and the inlet port of the second component, sliding and clamping the first end of the flexible-to-rigid tube over and to the tubular fitting of the first component, and sliding and clamping the second end of the flexible-to-rigid tube over and to the tubular fitting of the second component;
rigidizing the flexible-to-rigid tube after the routing step to increase the flexural modulus and burst strength of the flexible-to-rigid tube, wherein the rigidizing step includes the step of exposing the flexible-to-rigid tube to actinic radiation or heat to change the flexible-to-rigid tube from the flexible state to a rigid state via formation of a cross-linked network, and wherein the cross-linked network includes at least one of a silicone or triallyl isocyanurate (TAIC).

2. The method as recited in claim 1, wherein the cross-linked network is a polymerization reaction product of:
a polydimethylsiloxane (PDMS) having a pendant or terminal functional group selected from a group of functional groups consisting of epoxy functional groups, vinyl functional groups, and acrylate functional groups; and
an initiator.

3. The method as recited in claim 2, wherein the PDMS has a pendant or terminal epoxy functional group, wherein the initiator is an onium photoinitiator, and wherein the rigidizing step includes the step of exposing the flexible-to-rigid tube to actinic radiation.

4. The method as recited in claim 1, wherein the cross-linked network is a polymerization reaction product of:
triallyl isocyanurate (TAIC); and
an initiator selected from a group of initiators consisting of free radical photoinitiators and thermal initiators.

5. The method as recited in claim 4, wherein the initiator comprises a free radical photoinitiator including benzoin, and wherein the rigidizing step includes the step of exposing the flexible-to-rigid tube to actinic radiation.

6. The method as recited in claim 4, wherein the initiator comprises a thermal initiator including a benzoyl peroxide or azobisisobutyronitrile, and wherein the rigidizing step includes the step of exposing the flexible-to-rigid tube to heat.

7. A method of utilizing a flexible-to-rigid tube for interconnecting an outlet port of a first component and an inlet port of a second component, comprising the steps of:
routing the flexible-to-rigid tube in a flexible state, wherein a first end of the flexible-to-rigid tube is configured to be slid over and clamped to a tubular fitting that defines the outlet port of the first component, wherein a second end of the flexible-to-rigid tube is configured to be slid over and clamped to a tubular fitting that defines the inlet port of the second component, and wherein the routing step includes routing the flexible-to-rigid tube between the outlet port of the first component and the inlet port of the second component, sliding and clamping the first end of the flexible-to-rigid tube over and to the tubular fitting of the first component, and sliding and clamping the second end of the flexible-to-rigid tube over and to the tubular fitting of the second component;
rigidizing the flexible-to-rigid tube after the routing step to increase the flexural modulus and burst strength of the flexible-to-rigid tube, wherein the rigidizing step includes the step of exposing the flexible-to-rigid tube to actinic radiation or heat to change the flexible-to-rigid tube from the flexible state to a rigid state via formation of a cross-linked network, and wherein the cross-linked network includes a silicone.

8. The method as recited in claim 7, wherein the cross-linked network is a polymerization reaction product of:
a polydimethylsiloxane (PDMS) having a pendant or terminal functional group selected from a group of functional groups consisting of epoxy functional groups, vinyl functional groups, and acrylate functional groups; and
an initiator.

9. The method as recited in claim 8, wherein the PDMS has a pendant or terminal epoxy functional group, wherein the initiator is an onium photoinitiator, and wherein the rigidizing step includes the step of exposing the flexible-to-rigid tube to actinic radiation.

10. A method of utilizing a flexible-to-rigid tube for interconnecting an outlet port of a first component and an inlet port of a second component, comprising the steps of:
routing the flexible-to-rigid tube in a flexible state, wherein a first end of the flexible-to-rigid tube is configured to be slid over and clamped to a tubular fitting that defines the outlet port of the first component, wherein a second end of the flexible-to-rigid tube is configured to be slid over and clamped to a tubular fitting that defines the inlet port of the second component, and wherein the routing step includes routing the flexible-to-rigid tube between the outlet port of the first component and the inlet port of the second component, sliding and clamping the first end of the flexible-to-rigid tube over and to the tubular fitting of the first component, and sliding and clamping the second end of the flexible-to-rigid tube over and to the tubular fitting of the second component;
rigidizing the flexible-to-rigid tube after the routing step to increase the flexural modulus and burst strength of the flexible-to-rigid tube, wherein the rigidizing step includes the step of exposing the flexible-to-rigid tube to actinic radiation or heat to change the flexible-to-rigid tube from the flexible state to a rigid state via formation of a cross-linked network, and wherein the cross-linked network includes triallyl isocyanurate (TAIC).

11. The method as recited in claim 10, wherein the cross-linked network is a polymerization reaction product of:
triallyl isocyanurate (TAIC); and
an initiator selected from a group of initiators consisting of free radical photoinitiators and thermal initiators.

12. The method as recited in claim 11, wherein the initiator comprises a free radical photoinitiator including benzoin, and wherein the rigidizing step includes the step of exposing the flexible-to-rigid tube to actinic radiation.

13. The method as recited in claim 11, wherein the initiator comprises a thermal initiator including a benzoyl peroxide or azobisisobutyronitrile, and wherein the rigidizing step includes the step of exposing the flexible-to-rigid tube to heat.

* * * * *